(12) United States Patent
Pautsch et al.

(10) Patent No.: US 7,522,417 B2
(45) Date of Patent: Apr. 21, 2009

(54) MULTI-MODE FLUID COOLING SYSTEM AND METHOD

(75) Inventors: Adam G. Pautsch, Madison, WI (US); Timothy A. Shedd, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 89 days.

(21) Appl. No.: 11/396,206

(22) Filed: Mar. 30, 2006

(65) Prior Publication Data

US 2007/0230126 A1    Oct. 4, 2007

(51) Int. Cl.
  *H05K 7/20*    (2006.01)
  *F28F 7/00*    (2006.01)
(52) U.S. Cl. .................... 361/699; 165/80.4; 361/689
(58) Field of Classification Search .............. None
  See application file for complete search history.

(56) References Cited

U.S. PATENT DOCUMENTS

| | | | | |
|---|---|---|---|---|
| 4,397,158 A | * | 8/1983 | Brenik et al. | 62/380 |
| 5,675,473 A | * | 10/1997 | McDunn et al. | 361/699 |
| 5,907,473 A | * | 5/1999 | Przilas et al. | 361/699 |
| 5,943,201 A | * | 8/1999 | Walker et al. | 361/64 |
| 6,104,610 A | * | 8/2000 | Tilton et al. | 361/699 |

* cited by examiner

*Primary Examiner*—Gregory D Thompson
(74) *Attorney, Agent, or Firm*—Joseph T. Leone, Esq.; DeWitt Ross & Stevens S.C.

(57) ABSTRACT

A cooling system and method that significantly improves spray evaporative cooling by using a mixture of cooling fluids having different boiling points. The cooling fluid mixture is sprayed onto a surface to be cooled. Efficient cooling with reduced cooling fluid volume is provided by both evaporation of the more volatile component of the mixture as well as heating of the less volatile component which remains in contact with the surface being cooled. More uniform temperatures across the surface being cooled and a reduced risk of potentially damaging critical heat flux is achieved.

25 Claims, 4 Drawing Sheets

MULTI-MODE FLUID COOLING SYSTEM AND METHOD

This invention was made with United States government support awarded by the following agencies: NSF 0134510. The United States has certain rights in this invention.

FIELD OF THE INVENTION

This invention pertains generally to cooling systems and methods employing cooling fluids and, more particularly to such systems and methods as used to cool electronic circuitry in high-performance computers and similar systems using spray evaporative cooling and similar systems and methods and to the cooling fluids used in such cooling systems and methods.

BACKGROUND OF THE INVENTION

Removal of heat from electronic circuitry has become one of the limiting factors in the design and performance of most computer systems and many other electronic devices. Power dissipation of a computer increases approximately as the operating frequency squared. Thus, doubling the clock speed, roughly doubling computer system performance, will require nearly four times the power dissipation. Current microprocessors contain over one hundred million transistors. As the number of transistors increases with each new generation of microprocessor chips, the power draw and heat load (or total amount of heat) to dissipate during processor operation continues to increase. At the same time, the increasing processor heat loads coupled with smaller microprocessor footprints are causing the heat flux (heat load per unit area) to increase at a rapid rate.

Conventional cooling technologies such as fans and heat sinks are unable to absorb and transfer the excess heat dissipated by these new microprocessors. Attempts to cool these next generation microprocessors using conventional techniques are resulting in larger fans and larger heat sinks. The fans cause undesirable noise problems while metallic heat sinks add mass to computers and mechanical stress to the microprocessors to which they are attached. These mechanical factors can cause damage to the microprocessor during system transportation and handling.

Pumped liquid cooling systems have been used to provide improved thermal performance over conventional cooling technologies such as fan heat sinks and heat pipe heat sinks. Such systems typically include a cold plate heat sink that is attached to the microprocessor or other circuit to be cooled, a liquid-to-air heat exchanger, a single phase liquid pump, and connection tubing. A thermally conductive liquid coolant is circulated through the system by the pump. As the liquid passes through the cold plate heat sink, heat is transferred from the hot processor to the cooler liquid. The cold plate is designed in an attempt to maximize this heat transfer by maximizing the surface area to contact the cooling fluid flowing therethrough. For example, micro-channel cold plates utilize very fine fin channels through which the cooling fluid flows. Other cold plates employ powdered metal technology. Such cold plates use the high surface area density of bonded copper particles to enhance the effective heat transfer coefficient for heat dissipation. The hot liquid from the cold plate is then circulated through the liquid-to-air heat exchanger, that can be located at the rear of an electronic system enclosure or external to the enclosure. A system dedicated fan can be used to force air through the heat exchanger resulting in the transfer of heat to ambient air outside of the system enclosure. The cooled liquid then travels back through the system to repeat the process. Use of such closed liquid cooling systems is beginning to migrate from high performance computers to personal computers. It appears that liquid cooling systems will become more widely accepted and necessary in the future. However, even the best of such sealed pumped liquid cooling systems are limited in their ability to maintain low device temperatures without the use of refrigeration, and will not be able to satisfy the cooling demands of the next generation systems. This is because cold plates must be bonded to the outside of a chip package. Even a small amount of thermal resistance at the interface between the chip and the cold plate will create a large temperature difference between the cold plate and the chip. Without further innovation in the area of heat removal systems the development of a next generation computer design will be hampered.

One of very few practical ways to remove heat generated in the processing modules of very high-speed high-performance computers (supercomputers) is by forming sprays of small droplets that impinge on the heated surface forming a thin film of high velocity liquid directly on the computer chips. Heat is then transported from the surface by heating the flowing liquid and by boiling off some fraction of the liquid (two phase cooling). High heat removal rates are achieved because the liquid film is very well mixed by impinging spray droplets and bubbles formed by boiling. This mixing continually replenishes the supply of cool fluid at the heated surface. The limiting heat flux is reached when the liquid warms to its boiling point at any location on the surface being cooled. At this point the surface will dry out, the surface temperature will rise very quickly, and the device may be damaged. This method of heat removal is known as spray cooling, or spray evaporative cooling, and is a very efficient method of removing very high heat fluxes from small surfaces. Thus, spray evaporative cooling is growing in prominence and application in the cooling of electronics and laser diodes because of the need for high heat transfer in a small area in such applications.

The physical mechanisms of spray evaporative cooling are not completely understood. However, current research based on single nozzle spray systems suggests that less than 50% of the heat is removed through nucleate boiling, similar to boiling a pot of water on a stove. More than 50% of the heat is removed either directly by heating the flowing liquid film or by evaporation at the surface of the film. It also has been shown that the heat flux increases both with the area of the heated surface directly covered by the spray and by the flux of spray droplets impinging on the surface.

Current spray cooling systems and methods operate by spraying a dielectric fluid, e.g., Fluorinert 72 (FC-72), at a normal or other angle directly onto computer chips, from either above or below the chips, using a cone shaped spray. The objective is to create a thin film of cooling fluid on the surface to be cooled to remove heat through single phase and two phase convection. While such systems are adequate for most current computer systems and other electronic applications, the ability of such systems to remove heat has been pushed to its limits. For example, in such systems multiple nozzles often are used to direct multiple cone shaped cooling fluid sprays onto a surface to be cooled to increase the spray coverage area without increasing the package volume. However, in such systems the plumes of fluid that are sprayed from the nozzles tend to interact to create pockets of relatively low cooling fluid momentum, where the fluid tends to build up and where boiling often occurs. During the cooling process, bubbles are generated that cause greatly enhanced mixing so that heat is transported efficiently from the heated surface to the liquid surface. The temperature of the liquid surface is raised to the point that a large amount of evaporation occurs there, which is a safe and effective way to transport the heat away from the surface. Stagnation regions will stop the mechanical mixing, leading to bubble growth and dry out at the surface being cooled. Thus, the interaction of the sprays leads to inefficient cooling and liquid build-ups on the heated surface, creating regions of poor heat transfer and, therefore, non-uniform heat transfer across the surface of the chip. In the regions of poor heat transfer, the surface temperatures can rise significantly above the average surface temperature, causing the surface temperature to "run away", leading to catastrophic failure.

For optimal operation, it also is imperative that the coolant be removed from the spray region quickly and efficiently to prevent the buildup of warm liquid. Failures also can occur if the coolant liquid is not efficiently removed from the surface being cooled. Current spray cooling systems are limited in the ability to drain spray coolant after impacting a heated surface. In particular, in many such systems changing the orientation of the system even slightly will affect coolant drainage patterns, thereby adversely affecting the cooling ability of the system. This limits the application of current spray cooling systems in many applications where the system to be cooled is portable and thus subject to changes in orientation.

Thus, current spray cooling systems suffer from various limitations including low critical heat flux (burnout) conditions, non-uniform heat transfer over large areas (area coverage limitations), and orientation constraints due to draining patterns.

A partial solution to many of these limitations of conventional spray cooling systems is described in U.S. patent application Ser. No. 11/070,683, filed on Mar. 2, 2005, by the inventors of the present invention and entitled FULL COVERAGE SPRAY AND DRAINAGE SYSTEM AND METHOD FOR ORIENTATION-INDEPENDENT REMOVAL OF HIGH HEAT FLUX. This application describes a spray cooling system and method that significantly improves spray evaporative cooling by creating a directed momentum flow of cooling fluid across a surface to be cooled. A spray of cooling fluid is directed directly onto the surface of a work piece to be cooled at an angle with respect to the work piece surface so as to create a flow of cooling fluid in a substantially single direction along the work piece surface. The spray of cooling fluid may be delivered, for example, via a plurality of generally fan shaped sprays. The sprays are positioned and aligned to create cooling fluid coverage of the entire heated surface to be cooled without allowing interaction between the spray plumes in a manner that may cause areas of cooling fluid stagnation on the surface.

Further improvement in spray cooling effectiveness and efficiency may, nevertheless, be obtained. For example, research has found the highest heat removal rates are achieved through single phase (non-boiling) heat transfer, because the surface to be cooled remains in contact with the cooling liquid. In this case, however, significantly more cooling fluid is required to transport heat away from the surface being cooled than in a two phase cooling system where boiling may occur. This is because in two phase, or phase change systems, energy removed from the surface is stored by breaking the inter-molecular bonds holding the liquid molecules together. This process can absorb a very large amount of energy per unit mass of coolant. On the other hand, single phase cooling relies on sensible heating of the liquid, or increasing the temperature of the liquid, to store the energy removed from the surface. Thus, to take advantage of the cooling effectiveness of single phase cooling systems more cooling fluid is required along with bigger pumps and other mechanical systems to transport the greater amount of fluid through the system. This thus increases the cost, weight, and power consumption of the system. In addition, the temperature of the single-phase liquid will rise as heat is added, causing potentially large temperature variations across the surface being cooled, which may be quite undesirable.

What is desired, therefore, is an improved evaporative spray cooling system and method that can achieve improved cooling capacity using less cooling fluid volume, that provides more uniform cooling over a surface being cooled, and that reduces the likelihood of critical heat flux.

SUMMARY OF THE INVENTION

The present invention provides a method and system for cooling electronic circuitry and other surfaces that employs a multi-mode fluid cooling process: evaporation of a significant portion of the fluid will increase heat removal efficiency, while single phase sensible heating will keep the heated surface wet to prevent dryout failure. The present invention employs a mixture of cooling fluids with different boiling points to cool electronic circuitry and other surfaces. By using such a mixture both high heat removal and high heat transport can be obtained.

Pool boiling and flow boiling experimental results for mixtures of refrigerants and glycol/water mixtures that are documented in the literature indicate that heat transfer decreases with the use of coolant mixtures, sometimes by as much as 100% or more. This is thought to be due to the stratification of the mixture during the boiling process. That is, a temperature gradient forms in the mixture, driving the more volatile liquid away from the heated surface. This layer of liquid rich in one component acts as a resistance to the transport of the other component to a vapor, resulting in higher wall temperatures and lower performance.

In contrast, in a accordance with the present invention, a mixture of cooling fluids is sprayed onto the surface to be cooled using conventional or other spray cooling systems or methods. The spray application process forces the cooling fluid to remain well mixed, eliminating the detrimental concentration gradients that occur in more traditional applications using a mixture of cooling fluids. Once the temperature of the mixture impinging on the surface being cooled reaches the bubble point of the mixture (the temperature at which vapor begins to form), additional heat is removed primarily by evaporation rather than raising the fluid temperature. This will significantly reduce temperature variations across the surface being cooled. The less volatile fluid in the cooling fluid mixture remains liquid. Keeping a liquid-phase component in contact with the surface being cooled at all times also reduces the temperature variations across the surface being cooled. By remaining a liquid, the less volatile component ensures that the surface being cooled remains wetted, preventing large, potentially damaging, temperature fluctuations on the surface being cooled. The presence of the evaporative component of the mixture, however, allows for the removal of more heat for a given flow rate than when using just a pure liquid coolant, because significantly more thermal energy can be stored per unit mass through phase change versus heating a liquid.

The present invention thus addresses three important limitations of current spray cooling applications for electronics: uniform heat transfer over a large area, drainage of the spray coolant after impacting the heated surface, and low critical heat flux (burnout) conditions. The use of a less volatile component in a cooling fluid mixture in accordance with the present invention will help keep the fluid temperature uniform over the heated surface. The volatile component of the mixture will allow greater heat removal with less fluid flow, facilitating the removal of the fluid from the heated surface and the use of smaller pumps and heat exchangers. Critical heat flux is increased significantly because the temperature of the cooling fluid contacting the surface to be cooled will be kept below the boiling point of the less volatile component of the mixture at much higher rates than in a single component cooling fluid due to the added heat removal by evaporation of the more volatile component of the mixture.

Multi-mode fluid cooling in accordance with the present invention may be implemented in a spray cooling system including a reservoir of an appropriate cooling fluid mixture (e.g., a mixture of different Fluorinert or HFE cooling fluids, appropriate gasses such as argon and/or nitrogen, etc.), a pump for delivering the cooling fluid under pressure from the reservoir to a spray chamber to be sprayed therein from nozzles onto the work piece to be cooled, and appropriate filtering, metering, and control systems. Cooling fluid is returned from the spray chamber to the coolant reservoir via a drainage point or points in the spray chamber and a coolant fluid return path. Evaporated cooling fluid is returned from the spray chamber to the coolant reservoir via the coolant fluid drainage point or points and return path or via a separate vapor return path. The cooling fluid mixture may be sprayed onto the surface to be cooled using conventional spray nozzles providing cone shaped sprays or preferably using spray nozzles that provide generally fan shaped sprays directed at an angle toward the work piece surface that create a continuous flow of a thin film of cooling fluid in a substantially single direction across the work piece surface. Preferably the sprays are far enough apart so as not to interact with each other (in the direction of the fluid flow) either at the surface of the work piece or before contacting the work piece surface.

Further objects, features, and advantages of the present invention will be apparent from the following detailed description taken in consideration with the accompanying drawings.

DETAILED DESCRIPTION OF THE INVENTION

Figure 1:
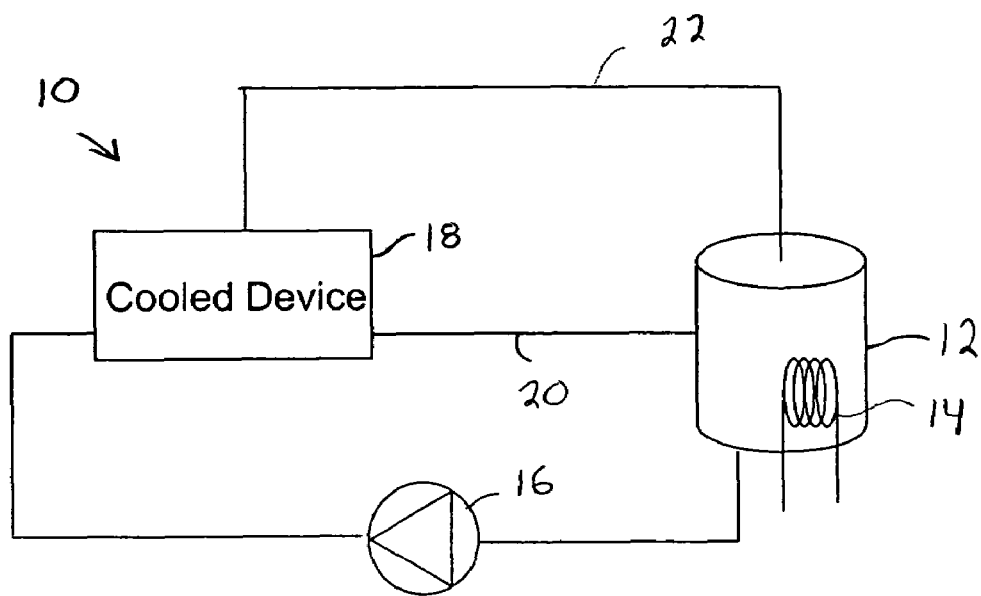
FIG. 1 is a schematic block diagram of an exemplary multi-mode fluid cooling system in accordance with the present invention.

The present invention will be described in detail herein with reference to the use thereof for the cooling of electronic circuits and electronic devices, particularly microelectronic circuitry as employed in computer systems, such as high-speed, high-performance computer systems (supercomputers). However, it should be understood that the present invention also may be applied in other applications, such as in the biomedical industry and for the cooling of laser arrays and high powered weaponry, etc. Spray evaporative cooling in accordance with the present invention may be applied to cryogenic devices, as an aid to laser-assisted surgical procedures, etc. It should also be understood that various combinations of cooling fluids other than those described herein may be used in a multi-mode cooling system and method in accordance with the present invention.

Multi-mode fluid cooling in accordance with the present invention is provided by spraying a cooling fluid mixture onto a surface to be cooled. The cooling fluid mixture contains at least two different cooling fluids having different boiling points. The cooling fluids in the mixture preferably are selected such that the more volatile cooling fluid, the cooling fluid with the lower boiling point, will evaporate during the cooling process. Heat removal by such evaporation reduces the increase in the temperature of the less volatile cooling fluid which remains in liquid form during cooling. This results in a more uniform cooling fluid temperature across the surface being cooled. Heat removal by evaporation of the more volatile cooling fluid component in the mixture allows for greater overall cooling capacity with less total cooling fluid flow, facilitating removal of the fluid and the use of smaller pumps and heat exchangers. In addition, critical heat flux is significantly reduced because the fluid temperature will be kept below the boiling point of the less volatile component of the cooling fluid mixture for much longer than in a single component system. Thus, the risk that the surface being cooled will dry out is reduced.

Any variety of combinations of appropriate cooling fluids may be employed for multi-mode cooling in accordance with the present invention. The combination of cooling fluids to be employed will depend upon the particular application and cooling performance to be achieved. For example, combinations of different commercially available Fluorinert and HFE cooling fluids for cooling electronic components will be described herein. (Fluorinert cooling fluids are commonly available from 3M Corporation.) Other similar or different dielectric or other coolant fluids, or combinations thereof, may be employed, depending upon the particular application. Such other fluids may include gasses such as nitrogen and/or argon, to enhance the desired performance of the cooling fluid mixture. In general, the cooling fluid mixture employed may be a mixture of any miscible liquids: Fluorinerts-HFEs, HFEs, Water-ammonia, water-LiBr, water-methanol, water-glycol, water-ethanol, water-proponal, Hydrocarbon mixtures, refrigerant mixtures, etc. Also, although binary cooling fluid combinations are described herein, more than two different cooling fluids having different boiling points may be included in a cooling fluid mixture in accordance with the present invention to achieve desired multi-mode cooling characteristics.

Multi-mode liquid cooling in accordance with the present invention may be implemented in an otherwise conventional spray evaporative cooling system that is able to manage both liquid and vapor cooling fluid. By applying the cooling fluid mixture as a spray onto a surface to be cooled, the spray droplet impingement process forces the cooling fluid to remain well mixed, eliminating the detrimental concentration gradients that occur in more traditional boiling applications using a mixture of cooling fluids. An example of a spray cooling system 10 that may be employed for multi-mode cooling in accordance with the present invention is illustrated in FIG. 1. A reservoir 12 is provided to contain the cooling fluid mixture to be employed. An appropriate conventional reservoir 12 may be selected for the particular coolant mixture to be employed. The coolant fluid preferably is degassed and filtered before being placed in the reservoir 12 of the fully evacuated system 10. The system 10 preferably may be pressurized, e.g., to 1 atmosphere, with nitrogen gas, which causes partial fluid saturation. It has been found that nitrogen-saturation of Fluorinert cooling fluids enhances cooling performance.

Means are provided to keep the cooling fluid in the reservoir 12 at a desired operating temperature. For example, a heat exchanger coil 14 may be positioned within the reservoir 12. The heat exchanger coil 14 contains a heat transfer fluid and is in fluid communication with a temperature controlled bath of such fluid. The heat transfer fluid from the bath is circulated through the heat exchanger coil 14 to maintain the cooling fluid mixture in the reservoir 12 at the desired operating temperature.

An appropriate pump 16 is employed to pump the cooling fluid mixture through the system 10. For example, a magnetically coupled gear pump or a similar pump may be employed.

The cooling fluid mixture is moved from the reservoir 12 by the pump 16 to a spray chamber 18 or other structure to be sprayed on a work piece therein to cool the work piece via multi-mode liquid cooling in accordance with the present invention. The spray chamber 18 designates the portion of the system 10 wherein the coolant fluid is sprayed onto a work piece to be cooled. For computer system applications, for example, the spray chamber 18 is a section of the computer system containing electronic circuitry to be cooled by the coolant fluid. However, the spray chamber 18 may be any closed or open area containing a work piece to be cooled by a coolant fluid mixture in accordance with the present invention.

As discussed above, in multimode fluid cooling in accordance with the present invention, some of the cooling fluid sprayed on a work piece in the spray chamber 18 (the more volatile component of the cooling fluid mixture) will evaporate during the cooling process while the remainder of the cooling fluid will remain in liquid form. Thus, the system 10 must be able to handle the return of both heated liquid and vapor cooling fluid from the spray chamber 18 back to the cooling fluid reservoir 12. This may be accomplished in any conventional manner, e.g., by providing separate liquid 20 and vapor 22 return paths from the spray chamber 18 to the reservoir 12. In many cases, however, it has been found that the vapor mixes well with the liquid cooling fluid, and thus both may be returned to the reservoir 12 from the spray chamber 18 via the same exit port and return path.

Figure 2:
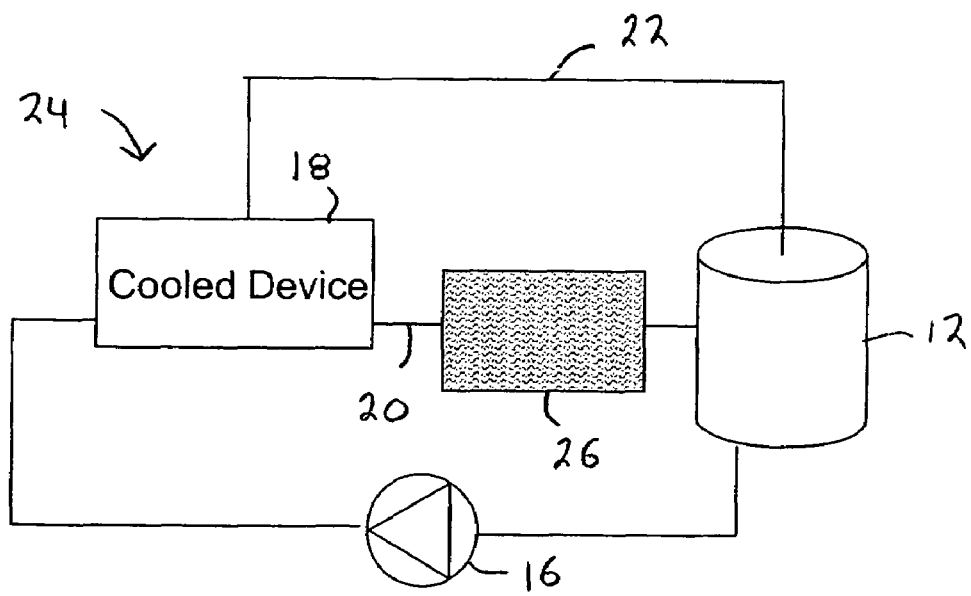
FIG. 2 is a schematic block diagram of an exemplary alternative embodiment multi-mode fluid cooling system in accordance with the present invention.

It should be understood that the particular components employed in a system 10 for providing multi-mode cooling in accordance with the present invention may depend upon the particular cooling fluid mixture employed and the particular application thereof. For example, the exemplary system 10, employing a liquid cooled reservoir 12, will enable good vapor management for a cooling fluid mixture in accordance with the present invention consisting of a mixture of Fluorinert-72 (FC-72) and Fluorinert-87 (FC-87) cooling fluids. For a mixture of higher boiling point cooling fluids, an alternative embodiment system 24, such as is illustrated, for example, in FIG. 2 may be employed. This alternative system 24 is similar to the system 10 illustrated in and described with respect to FIG. 1. In the alternative embodiment system 24, however, a conventional fan-cooled heat exchanger 26 is employed on the fluid return path 20 from the spray chamber 18 to the reservoir 12 to reduce the temperature of the cooling fluid mixture in the reservoir 12 to the desired operating temperature. It should be understood that a combination of the means illustrated in FIGS. 1 and 2 for controlling the temperature of the cooling fluid mixture, or other conventional current or future means for controlling the temperature of the cooling fluid mixture, may be employed for multi-mode cooling in accordance with the present invention.

It should also be understood that other conventional components of conventional spray cooling systems may be employed in a spray cooling system providing multi-mode liquid cooling in accordance with the present invention. For example, appropriate filters and absorbers preferably are employed to remove any particles or foreign gases, including water vapor, from the coolant fluid mixture in the system. An absorber preferably also may be employed to remove perfluoroisobutylene (PFIB) from the coolant fluid mixture. (PFIB is a harmful compound that can result from Fluorinert breakdown at extremely high heat levels.) The coolant fluid mixture flow preferably is passed through a conventional appropriate flow meter that measures, e.g., the volumetric flow rate of the coolant. Rate of flow data from the flow meter may be provided in a conventional manner to a system controller. Additional system operation information that preferably may be provided to the controller may include system pressure and coolant fluid temperature. System pressure information may be provided to the controller via a conventional and appropriate pressure sensor mounted in the system, e.g., in the coolant fluid reservoir 12. Coolant fluid temperature information may be provided by one or more conventional and appropriate temperature sensors. Preferably at least one temperature sensor is positioned to measure the temperature of the coolant fluid flow just before the coolant fluid enters the spray chamber 18, wherein the coolant fluid is sprayed onto the work piece to be cooled. For example, a temperature sensor may be implemented as part of the coolant fluid flow meter. Based on coolant fluid flow rate, pressure, and temperature feedback information, as well as any other or different feedback information as may be provided, such as the measured temperature of the work piece to be cooled, the controller may control operation of the pump 16 to provide coolant fluid at the desired pressure from the reservoir 12 to the spray chamber 18. The controller may be implemented in a conventional manner using conventional digital and/or analog circuitry to control the providing of coolant to the spray chamber 18 to provide the desired cooling for a work piece therein. Note that for application in a computer or other similar system, the controller may be implemented, at least in part, in microelectronic circuitry located in the spray chamber 18 that is cooled by the system 10,24 under control of the controller.

A cooling fluid mixture in accordance with the present invention may be sprayed on a surface to be cooled to provide multi-mode cooling in accordance with the present invention using conventional spray nozzles and methods. For example, conventional single or multiple spray nozzles providing cone shaped sprays may be employed for this purpose. More preferably, however, the spray cooling methods and nozzles described in U.S. patent application Ser. No. 11/070,683, filed on Mar. 2, 2005, by the inventors of the present invention and entitled FULL COVERAGE SPRAY AND DRAINAGE SYSTEM AND METHOD FOR ORIENTATION-INDEPENDENT REMOVAL OF HIGH HEAT FLUX, the details of which are incorporated herein by reference, may be employed.

Figure 3:
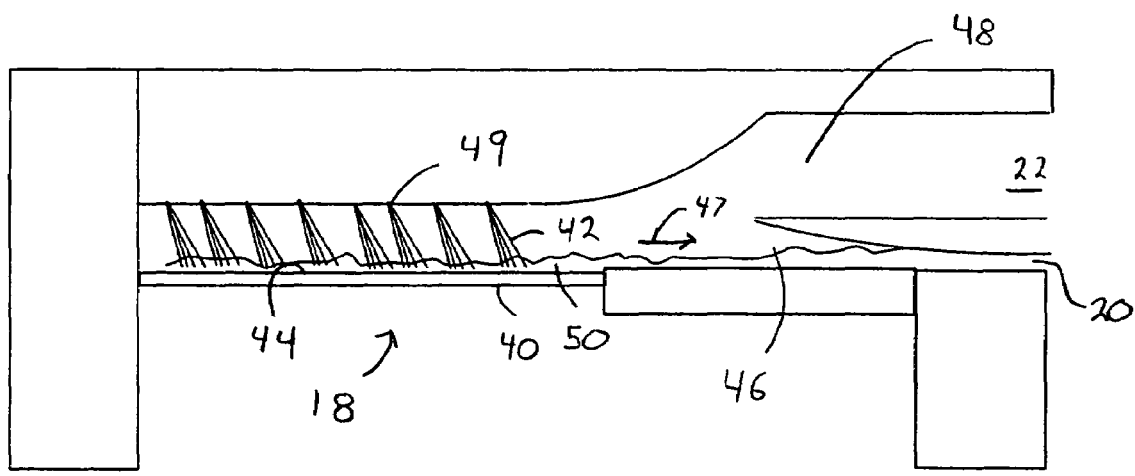
FIG. 3 is a schematic cross section illustration of a spray chamber in which a multi-mode cooling fluid in accordance with the present invention is being used to cool a heated surface.

An exemplary method and structure in accordance with the present invention for spraying a coolant fluid mixture onto a work piece to be cooled for multi-mode cooling in accordance with the present invention will be described now briefly with reference to the schematic cross-sectional view of a spray chamber 18 illustrated in FIG. 3. The coolant fluid mixture illustrated in, and described with reference to, FIG. 3 may be provided to the structure described with reference to FIG. 3 by the systems 10 and 24 and methods described above with reference to FIGS. 1 and 2.

A work piece 40 to be cooled may be, for example, an integrated circuit chip or other electronic or non-electronic device or structure. The work piece 40, as illustrated, is relatively thin in thickness. To cool the work piece 40, e.g., during operation thereof, a coolant fluid mixture 42 is sprayed on at least one of the relatively flat and broad larger substantially two-dimensional surfaces of the work piece 40. As described above, the coolant fluid mixture preferable includes at least two different cooling fluids having different boiling points. For purposes of this example, the broad surface of the work piece 40 onto which the coolant fluid 42 is sprayed will be referred to as the top surface 44 thereof. Note that for an integrated circuit chip work piece 40 the surface 44 thereof to be cooled may be a surface of the chip itself, a surface of packaging containing the chip, or the surface of a heat spreader or other structure mounted on the chip or chip package. The top surface 44 of the work piece 40 has two elongated dimensions which will be referred to, for example, as the length of the work piece (extending along the page in FIG. 3) and the width of the work piece (extending into the page in FIG. 3). Of course, these terms are interchangeable, and it should be understood that the term "width" as used herein, including in the claims, may refer to any dimension of an integrated circuit chip or other work piece 40 or surface or area to be cooled in accordance with the present invention.

The work piece 40 may be mounted for operation in the spray chamber 18 in a conventional manner. It should be understood, for example that many integrated circuit chips and other electronic devices may be mounted in a spray chamber 18 for operation. Each such chip or other device or work piece may be cooled by a method and system in accordance with the present invention as described herein.

Within the spray chamber 18 there is provided at least one liquid drain point 46. The work piece 40, and particularly the top surface 44 thereof to be cooled, is in a certain position with respect to the liquid drain point 46. The coolant fluid mixture 42 preferably is sprayed onto the work piece 40 to cool the work piece 40 such that the coolant fluid flows across the top surface 44 of the work piece 40 in a substantially single direction 47. The drain point 46 may, therefore, preferably be positioned with respect to the work piece 40 such that the flow of the liquid cooling fluid 42 from the work piece surface 44 is directed 47 toward the drain point 46 to be returned therefrom from the spray chamber 18 to the coolant fluid reservoir 12 via the liquid cooling fluid return path 20. By using the directed momentum flow of the cooling fluid 42 to direct the cooling fluid 42 toward the drain point 46, proper drainage of the cooling fluid 42 can be achieved despite changes in orientation of the cooling system 10.

A vapor drain point 48 also may be provided in the spray chamber 18. As discussed above, the more volatile component of the cooling fluid mixture 42 sprayed onto the work piece 40 to be cooled will evaporate during the cooling process. The resulting vapor may be drawn from the spray chamber 18 via the vapor drain point 48 and returned to the coolant fluid reservoir via the vapor cooling fluid return path 22. As also discussed above, however, in many cases the vapor mixes well with the liquid and flows through the same exit port. In such cases a single drain point 46 and return path 20 may be employed.

In accordance with the present invention, the coolant fluid mixture 42 preferably is sprayed directly onto the surface 44 of the work piece 40 to be cooled to create a flow of cooling fluid 42 in a substantially single direction 47 along the work piece surface 44. This directed momentum flow 47 of cooling fluid 42 across the surface 44 of the work piece 40 is achieved by spraying the cooling fluid 42 onto the surface 44 at an angle with respect thereto via one or more spray nozzles 49.

In accordance with the present invention, the spray nozzles 49 preferably are positioned to spray the coolant fluid 42 directly onto the surface 44 of the work piece 40 to be cooled, rather than transversely across or indirectly onto the surface 44 of the work piece 40. The nozzle openings preferably are positioned with respect to the surface 44 of the work piece 40 such that lines extending perpendicularly from the surface 44 of the work-piece 40 will intersect the nozzle openings. In other words, the nozzles 49 preferably are located directly "above" the work piece 40 to be cooled. (Although it should be understood that the combination of the work piece 40 and nozzles 49 may be oriented together in space vertically side by side or in some other orientation.) The distance between the spray nozzle 49 openings and the surface 44 of the work piece 40 to be cooled preferably may be in the range of 3-5 mm, although other distances therebetween also may be employed in accordance with the present invention.

In accordance with the present invention, the spray nozzles 49 preferably generate a substantially fan shaped spray 42 of cooling fluid. That is, a spray shape that is significantly longer in a first direction than in a second, perpendicular, direction. For example, such a substantially fan shaped spray may be generated using slot shaped nozzles 49. Preferably, the slot shaped spray nozzles 49 may be, in their longer dimension, approximately as wide as the chip or other work piece 40 to be cooled, such that the fan of coolant spray 42 provided by the nozzle 49 extends across the surface 44 of the chip in one direction. (Full coverage across the width of the work piece surface 44 may be achieved using a smaller slot providing a greater fan-out of spray in the longer dimension, although this is not preferred.) Thus, for example, a slot shaped spray nozzle 48 having a nozzle orifice width in the shorter dimension of significantly less than 100 microns, and preferably about 4 microns, and a nozzle orifice width in the other dimension of 15-25 mm may be used to spray coolant onto the surface of a conventional integrated circuit chip that is 15-25 mm across, such that the spray provided thereby extends across the surface 44 of the chip 40. (A very narrow orifice width preferably is used both to limit the spread of the spray in the dimension along the length of the work piece 40 being cooled as well as to keep the total orifice size (width times length) on the same order of magnitude as that of conventional cone shaped spray nozzles with circular orifices typically 150-200 microns in diameter.)

Preferably a plurality of spray nozzles 49 for cooling a given work piece 40 are aligned along a single axis extending along the length of the work piece 40. The spray nozzles 49 preferably are aligned such that the longer dimensions of the nozzle orifices are perpendicular to this axis, and are spaced apart from each other along this axis sufficiently such that the spray of coolant fluid 42 provided by each of the spray nozzles 49 doesn't interfere with the spray provided by any of the other adjacent spray nozzles 49. In other words, as illustrated in FIG. 3, the substantially fan shaped coolant sprays 42 from adjacent nozzles 49 preferably do not cross or intersect either at the surface 44 to be cooled or before the sprays 42 contact the surface 44. By preventing interaction of the cooling fluid sprays 42, areas of fluid flow stagnation on the surface 44 of the work piece 40 being cooled are avoided.

In accordance with the present invention, the spray nozzles 49 are oriented so as to direct the cooling fluid 42 directly onto the surface 44 of the work piece 40 to be cooled at an angle with respect thereto. For example, an angle of between approximately 30 and 60 degrees with respect to the surface 44 of the work piece 40, and preferably an angle of approximately 45 degrees, may be employed. All of the nozzles 49 directing fluid at a single work piece 40 preferably are oriented at the same angle with respect thereto, to prevent crossing or other interaction of the sprays 42 provided thereby. Varying angles may be used, however, in some cases, to control the rate of flow of coolant fluid across the surface 44 of the work piece 40.

Sufficient nozzles 49, each configured and oriented as describe above, preferably are provided for each chip or other work piece 40 to be cooled, such that the combined spray of coolant 42 on the surface 44 of the work piece 40 maintains a full coverage thin film 50 of cooling fluid 42 on the surface 44. (This is achieved even though the entire surface 44 to be cooled is not covered by the areas of the sprays 42 themselves.) Depending on the coolant fluid flow rate, heat flux to be removed, etc., one nozzle every 5 mm or so along the chip or other work piece 40 may be sufficient.

Coolant fluid 42 sprayed onto the surface 44 of a work piece 40 in a manner in accordance with the present invention as just described creates a thin film 50 of coolant fluid thereon that flows continuously in a substantially single direction 47 across the surface 44, to cool the work piece 40 by the mechanisms and in the manner discussed above. Such a system and method for spray cooling in accordance with the present invention has several benefits over the round sprays used in conventional spray cooling systems. Since the angled fan-shaped sprays do not overlap, they create a directed uniform flow of fluid across the surface 44 and there are no stagnation points. Multiple sprays along the length of the surface 44 being cooled help break up growing bubbles, suppressing the occurrence of critical heat flux. The angled sprays provide momentum to the fluid flow in a preferred substantially single direction 47. This does two things. First, it keeps the film 50 thinner and more uniform than it would be from a perpendicularly directed spray. Second, it allows the designer to direct the fluid for better drainage.

A preferred spray nozzle array for use in providing a fan shaped spray of a cooling fluid mixture in accordance with the present invention may be formed from an array of small tubes. An exemplary spray nozzle array of this type is described in detail in the above mentioned U.S. patent application Ser. No. 11/070,683, filed on Mar. 2, 2005, by the inventors of the present invention and entitled FULL COVERAGE SPRAY AND DRAINAGE SYSTEM AND METHOD FOR ORIENTATION-INDEPENDENT REMOVAL OF HIGH HEAT FLUX, the details of which are incorporated herein by reference. Such a spray nozzle array may be formed from conventional metal microbore tubing. Such tubing may, for example, typically have an outer diameter on the order of 1/16 inch, with a tube wall thickness of approximately 1/64 inch. (It should be understood that microbore or other tubing having different dimensions also may be used.) One or more spray nozzles are formed along the length of the tubing by cutting (e.g., using a slitting saw), stamping, or otherwise forming one or more slots at an angle into the wall of the tube. (The method used for forming the slots in the tube preferably may form a relatively rough slot well. The resulting rough surfaces in and around the slot well help to increase the production of spray droplets forming the cooling fluid spray formed by the slots.) The slots preferably are formed at a desired angle into the wall of the tube to correspond to the desired angle at which a spray of cooling fluid to be generated from the nozzles formed thereby is to be directed at the surface of a work piece to be cooled. Thus, the slots preferably may be formed at an angle of between 30° and 60° into the wall of the tube. The slots may be formed at a depth through the wall of the tube such that the slots are in fluid communication with the tube bore. Alternatively, and preferably, the slots may be formed partially through the tube wall and a small hole or other aperture drilled, punched, or otherwise formed in the slot to connect the slot in fluid communication with the tube bore. The width of the slot is selected such that when pressurized cooling fluid is provided to the tube bore, from either or both ends of the tube, a fan shaped spray of cooling fluid is directed from the slot formed in the tube at the desired angle. For example, a slot width of approximately 150 micrometers may be used. A plurality of slots preferably are formed spaced apart along the length of the tube such that the sprays of cooling fluid formed by the slots do not interact before contacting, or at the surface of, the work piece being cooled.

A plurality of nozzle tubes as described above may be formed in an array and used to provide multi-mode spray cooling of a work piece in accordance with the present invention. For example, the size of the array of tubes may correspond approximately to the size of the work piece surface to be cooled. Thus, the lengths of the tubes in the array may be selected to correspond to the length of a work piece surface to be cooled, with sufficient tubes placed side-by-side in the array such that the width of the array corresponds to the width of a work piece surface to be cooled. The tubes forming the array are positioned such that the slots formed in adjacent tubes are aligned across the width of the array. Thus, adjacent slots in adjacent tubes across the width of the array form a linear array of nozzle orifices that may be used to produce, in combination, a fan shaped spray of cooling fluid that extends across the width of a work piece surface to be cooled. As discussed above, the slots preferably are formed spaced apart along the length of each tube in the array such that arrays of adjacent slots in adjacent tubes across the width of the tube array are separated from each other by sufficient distance such that the fan shaped sprays of cooling fluid generated thereby do not interact before contacting, or at the surface of, the work piece being cooled. (E.g., the rows of adjacent slots formed in the tubes may be separated by approximately 5 mm.)

Pressurized cooling fluid may be provided to the array of nozzle tubes, at either or both ends thereof, via one or more manifold structures. For example, the manifold structures may be formed of an appropriate metal or plastic material with a slot formed therein for receiving the ends of the tubes forming the array. (For example, for an array formed using microbore tubes having an outer diameter of 1/16 inch, an approximately 5/64 inch wide slot may be formed in the manifold, e.g., using a ball-end mill, to a depth of approximately 4 mm, to support the tube array therein.) An appropriate epoxy may be used to seal the ends of the tubes in the slot formed in the manifold. Pressurized cooling fluid thus may be provided to either or both ends of the array of nozzle tubes via the manifolds and the slots formed therein in which the ends of the tubes are mounted and sealed.

The tubes forming the array of tubes may be positioned closely adjacent to each other. Alternatively, the tubes, or some of the tubes, in the array may be spaced slightly apart (but preferably not so far apart such that a continuous fan shaped spray across the width of the work piece being cooled by the array is not provided at the surface of the work piece). The resulting gap between adjacent tubes may be used conveniently to vent cooling fluid vapor resulting from evaporation of the more volatile component of the cooling fluid mixture sprayed onto the work piece away from the work piece being cooled. Vapor vent tubes, with vent apertures formed therein, may be positioned in the gaps between nozzle tubes in the array and coupled to a vapor return path 22 to the fluid reservoir 12 to provide this vapor venting function.

Figure 4:
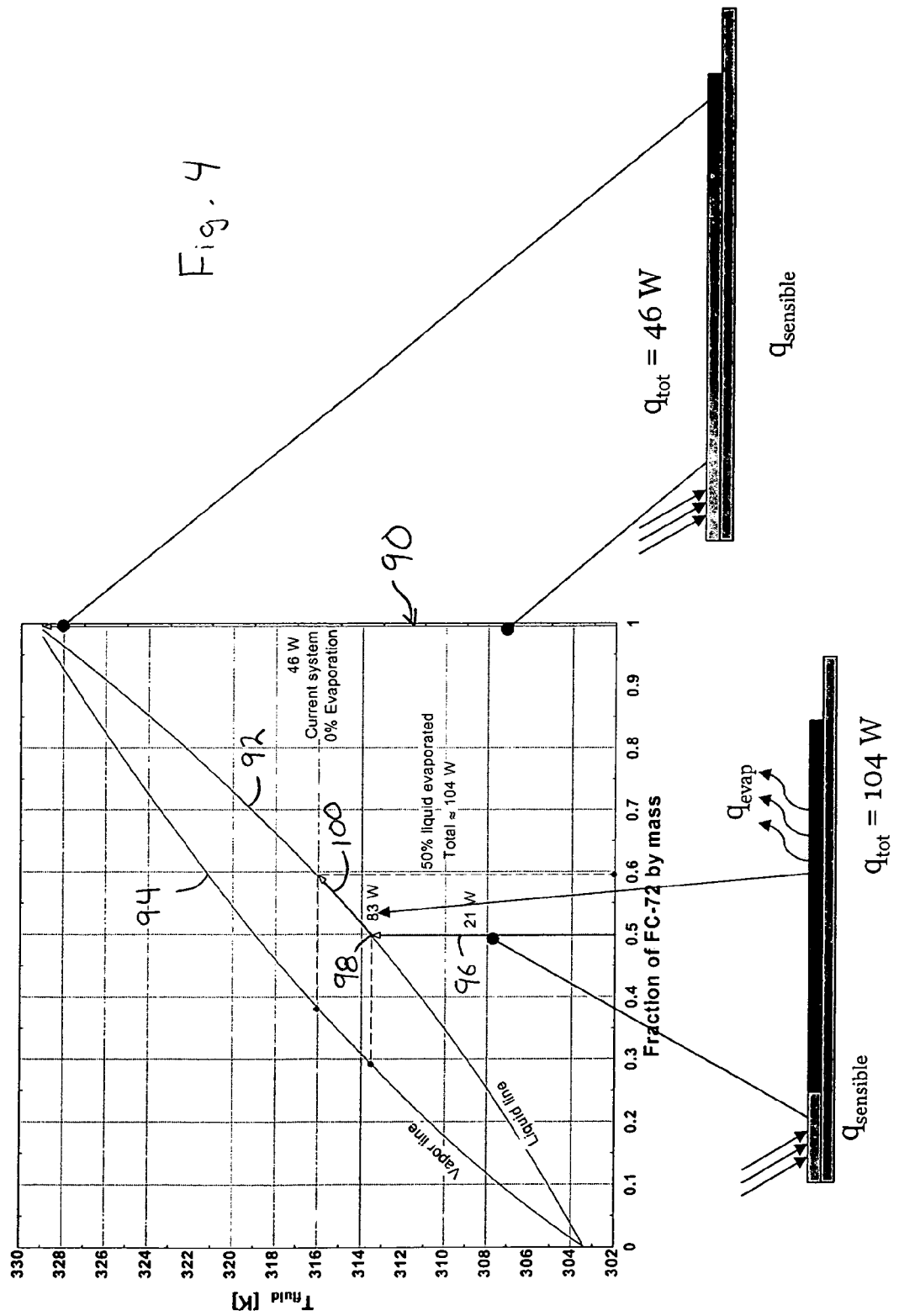
FIG. 4 illustrates by example how a multi-mode cooling fluid in accordance with the present invention operates to provide improved cooling performance.

An example illustrating the theoretical ability of multi-mode cooling in accordance with the present invention to provide enhanced total cooling will now be described with reference to FIG. 4. FIG. 4 includes a plot 90 of the liquid (dew point) 92 and vapor 94 (bubble point) lines at 100 kPa for a mixture of FC-87 and FC-72 cooling fluids by fraction of FC-72 by mass in the mixture. (The boiling point of FC-87 is approximately 30° C., the boiling point of FC-72 is approximately 56° C.) Consider such a liquid mixture that is half (by mass) FC-72 and half FC-87. As the sub cooled liquid mixture is sprayed on the heated surface to be cooled, the impinging liquid absorbs thermal energy and the liquid temperature begins to rise along line 96. Once the temperature rises to the liquid line (bubble point) 98, evaporation begins. For the mixture being described, the resulting vapor is about 70% FC-87 and about 30% FC-72 (most of the evaporation is due to the more volatile component of the mixture). This changes the composition of the mixture at the surface being cooled, and the temperature of the remaining liquid cooling fluid continues to rise some, along line 100, as thermal energy is added. Evaporation of about 50% of the mixture will remove about 104 W, leaving liquid that is 60% by mass FC-72. This total heat removal $q_{tot}$ includes a component of heat, $q_{sensible}$ (21 W), absorbed by the liquid cooling fluid mixture and a component, $q_{evap}$ (83 W), due to evaporation. The corresponding total heat removal for a cooling fluid consisting of 100% FC-72, with 0% evaporation (single mode, single phase cooling) is only 46 W.

Experiments have been performed to compare the heat transfer performance of various liquid mixture coolant compositions with that of pure fluids. These experiments were conducted using a conventional spray cooling tester in which a cooling fluid is sprayed using single and multiple cone shaped sprays onto heated test chips. Temperature measurements are taken at various locations on the test chips.

The first mixture chosen for testing was a 75%/25% mixture of FC-72 and FC-40. The boiling curve for this mixture, which also was experimentally determined, indicated that this mixture should have only a slightly elevated initial boiling point over that of pure FC-72 at 95 kPa. In addition, the vapor generated should be nearly 100% FC-72, which should ensure that FC-40 remains to keep the surface wetted even if much of the FC-72 evaporates.

The FC-40 is significantly more viscous than FC-72 (3.4 cp vs 0.64 cp at 25° C.) and is about 10% more dense. FC-40 boils at 155° C. at 101 kPa, compared with 56° C. for FC-72. The thermal conductivity of FC-40 is about 15% higher than that of FC-72.

The mixture density was determined using a coriolis flow meter and found to be 1720 kg/m³ at 25° C. This is nearly exactly equal to the volume density, $$\rho_{mix} = y\rho_A + (1-y)\rho_B \quad (1)$$

where y is the volume fraction of component A and, for this case, A refers to FC-72 and B refers to FC-40.

The mixture viscosity is slightly more complex and a falling-ball viscometer was used to determine both the absolute viscosity of the mixture and its dependence on temperature. The results are presented in Table 1. The viscosity data were correlated by:

$$\mu_{mix} = 1.705 - 0.0381T \quad (2)$$

where the viscosity, μ, is in units of centipoises (cp) and the temperature, T, is in units of ° C.

TABLE 1

Properties of FC-72 and FC-40 and a 75%/25% mixture of the two

| | FC-72 | | FC-40 | | Mixture | |
|---|---|---|---|---|---|---|
| Temp. [° C.] | μ [kg/m-s] | ρ [kg/m^3] | μ [kg/m-s] | ρ [kg/m^3] | μ [kg/m-s] | ρ [kg/m^3] |
| 10 | 0.00080 | 1714 | 0.0047 | 1882 | 0.00169 | 1756 |
| 15 | 0.00074 | 1701 | 0.0042 | 1871 | 0.00163 | 1744 |
| 20 | 0.00069 | 1688 | 0.0037 | 1860 | 0.00159 | 1731 |
| 25 | 0.00064 | 1675 | 0.0032 | 1849 | 0.00154 | 1719 |
| 30 | 0.00060 | 1662 | 0.0028 | 1839 | 0.00150 | 1706 |
| 35 | 0.00056 | 1649 | 0.0025 | 1828 | 0.00146 | 1694 |
| 40 | 0.00052 | 1636 | 0.0022 | 1817 | 0.00144 | 1681 |
| 45 | 0.00049 | 1623 | 0.0020 | 1806 | 0.00139 | 1669 |
| 50 | 0.00045 | 1610 | 0.0018 | 1796 | 0.00139 | 1657 |

Figure 5:
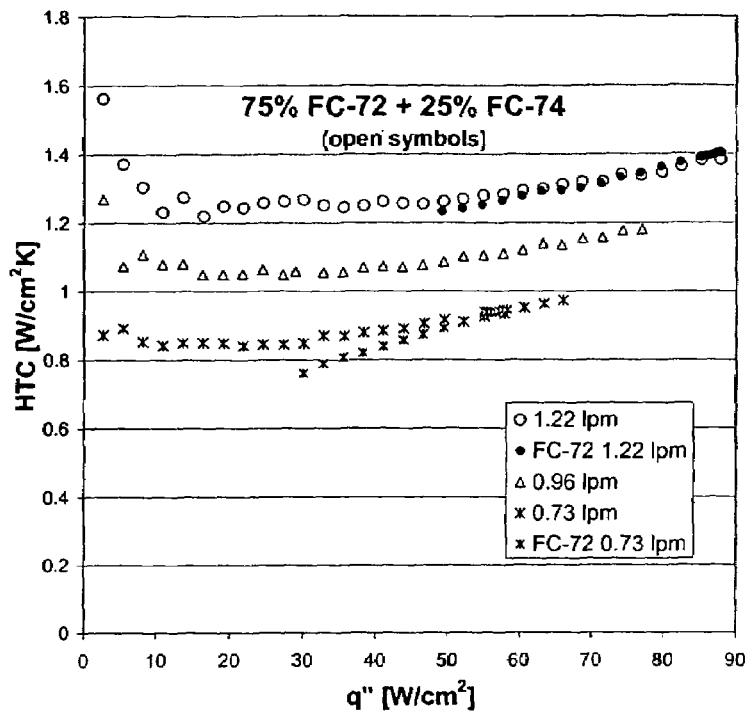
FIG. 5 is a plot of experimental representative heat transfer performance data from the spraying of a mixed cooling fluid in accordance with the present invention versus spraying of a pure cooling fluid.

Representative heat transfer performance data are presented in FIG. 5 for spraying of a mixed cooling fluid of 75% FC-72 and 25% FC-74 using four conical nozzle arrays. Unlike the behavior of pool boiling or in-tube flow boiling, there is no decrease in heat transfer performance due to mixture effects.

The chip surface temperature data contain additional significant findings. The temperature variation across the chip is about 20% lower with the mixture than with FC-72 alone. The average chip surface temperature is about 10° C. higher with the mixture than with FC-72 alone. Because of the higher surface temperatures, and the high boiling point of FC-74, the thermal test chips reached their thermal shutdown limit (110° C.) before reaching CHF. These results indicate that controlled evaporation in the mixture may be helping to create a more uniform surface temperature.

Figure 6:
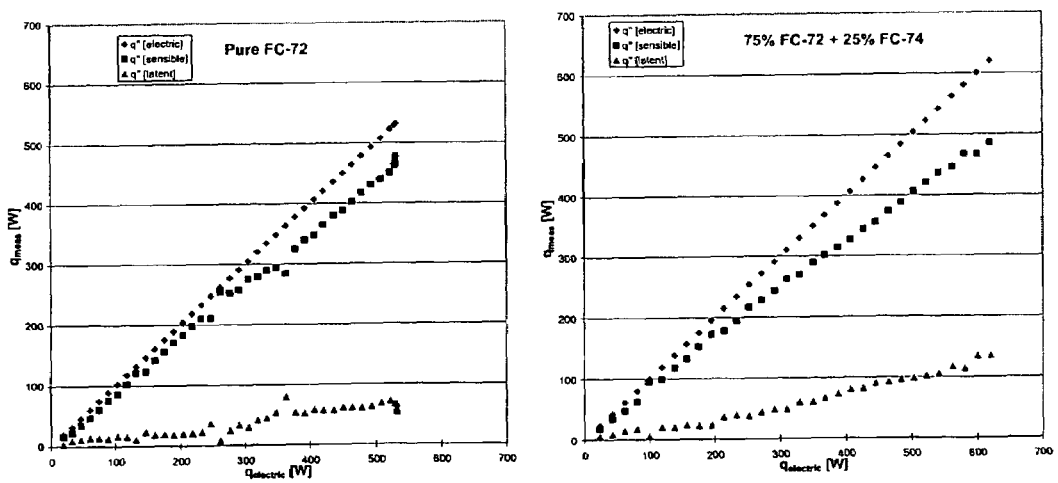
FIG. 6 is a plot of experimental representative performance of four-nozzle conical sprays using pure cooling fluid and a mixed cooling fluid in accordance with the present invention.

FIG. 6 illustrates the latent/sensible heat partitioning based on the measurements for four-nozzle conical spray arrays using pure FC-72 and a 75%/25% mixture of FC-72 and FC-74 flowing at 1.15 lpm for a multi-chip module. First, it is notable that the mixture will operate to much higher heat loads than pure FC-72. In fact, the tester was unable to reach the peak heat flux limit of the mixture due to the limits of the power supply. Second, by the addition of just 25% of a less volatile fluid (FC-74 boils at approximately 100° C. at 101 kPa), the amount of heat removed through evaporation ($q''_{latent}$) increases by a factor of 2.

FIG. 5 illustrates the latent/sensible heat partitioning based on the measurements for three different total spray cap flow rates for the four-nozzle arrays (P-chips). Due to uncertainty in the temperature measurements, the lower heat rate data can be ignored. The latent heat contribution varies quite a bit more with heat flux for these data than for the single nozzle arrays. No effect of flow rate is evident, as was the case with the single-nozzle arrays. At the higher heat fluxes, the latent component makes up about 20% to 25% of the total heat removal.

The experimental results for this single exemplary cooling fluid mixture indicate that heat transfer performance was not significantly degraded by the use of a mixture versus a single cooling fluid. This behavior is different from typical pool and flow boiling data and supports the conclusion that the cooling fluid remains well mixed if applied to a surface to be cooled by spraying. The CHF is significantly enhanced using the mixture. Temperature variations across the test chips were reduced by about 20%. These results indicate that, even with traditional spray nozzles, the present invention improves key performance measures (peak heat flux (CHF) and temperature uniformity).

It should be understood that the present invention is not limited to the particular exemplary applications and embodiments as illustrated and described herein, but embraces all forms thereof as come within the scope of the following claims.

What is claimed is:

1. A method for cooling a work piece surface, comprising:
   (a) providing a cooling fluid mixture including a first cooling fluid having a first lower boiling point and a second cooling fluid having a second higher boiling point and selected such that a temperature of the work piece surface to be cooled is higher than the first lower boiling point and lower than the second higher boiling point; and
   (b) directing a spray of the cooling fluid mixture directly onto the work piece surface to be cooled from a spray nozzle that is positioned with respect to the work piece surface such that a line drawn perpendicular to the work piece surface intercepts a spray orifice of the spray nozzle.

2. The method of claim 1 wherein directing a spray of the cooling fluid mixture directly onto the work piece surface includes directing a conical spray of the cooling fluid mixture directly onto the work piece surface from the spray nozzle.

3. The method of claim 1 wherein directing a spray of the cooling fluid mixture directly onto the work piece surface includes directing a spray of the cooling fluid mixture directly onto the work piece surface at an angle with respect thereto such that the force of the spray of the cooling fluid mixture creates a flow of at least the second cooling fluid in a substantially single direction along the work piece surface.

4. The method of claim 3 wherein directing a spray of the cooling fluid mixture directly onto the work piece surface includes directing a plurality of sprays of the cooling fluid mixture directly onto the work piece surface at the same angle with respect thereto from a plurality of spray nozzles that are positioned with respect to the work piece surface such that lines drawn perpendicular to the work piece surface intercept spray orifices of the plurality of spray nozzles.

5. The method of claim 4 wherein the plurality of sprays of cooling fluid mixture are substantially fan shaped sprays.

6. The method of claim 5 wherein the plurality of fan shaped sprays have a spray width at the work piece surface corresponding approximately to a width of the work piece surface.

7. The method of claim 5 wherein the plurality of spray nozzles are a plurality of slot nozzles positioned adjacent to the work piece surface.

8. The method of claim 7 wherein the plurality of slot nozzles are formed in at least one tube positioned adjacent to the work piece surface.

9. The method of claim 4 wherein the plurality of sprays do not interact with each other either at the work piece surface or before contacting the work piece surface.

10. The method of claim 3 wherein the spray of cooling fluid mixture is directed onto the work piece surface at an angle of between approximately 30 degrees and 60 degrees with respect thereto.

11. The method of claim 3 wherein the spray of cooling fluid mixture is directed onto the surface of the work piece a flow of at least the second cooling fluid in a substantially single direction along entire width of the work piece surface.

12. The method of claim 1 wherein the first cooling fluid is a Fluorinert and the second cooling fluid is a different Fluorinert.

13. The method of claim 1 wherein the cooling fluid mixture comprises a combination of miscible liquids selected from the group of combinations of miscible liquids consisting of: Fluorinerts-HFEs, HFEs, water-ammonia, water-LiBr, water-methanol, water-glycol, water-ethanol, water-propanol, hydrocarbon mixtures and refrigerant mixtures.

14. The method of claim 1 wherein the cooling fluid mixture includes a gas selected from the group of gasses consisting of nitrogen and argon.

15. An apparatus for cooling a work piece having a surface, comprising:
   (a) a reservoir for containing a cooling fluid mixture;
   (b) a cooling fluid mixture including a first cooling fluid having a first lower boiling point and a second cooling fluid having a second higher boiling point contained in the reservoir and selected such that a temperature of the work piece to be cooled is higher than the first lower boiling point and lower than the second higher boiling point;
   (c) at least one spray nozzle adapted to produce a spray of the liquid cooling fluid mixture when the cooling fluid mixture is provided under pressure to the at least one spray nozzle and positioned with respect to the work piece surface such that a line perpendicular to the work piece surface intercepts a spray orifice of the spray nozzle; and
   (d) a pump coupled to the reservoir and to the at least one nozzle for providing cooling fluid mixture under pressure to the at least one nozzle.

16. The apparatus of claim 15 wherein the at least one nozzle produces a conical spray when the cooling fluid mixture is provided thereto under pressure.

17. The apparatus of claim 15 comprising a plurality of nozzles adapted to produce a plurality of substantially fan shaped sprays when the cooling fluid mixture is provided under pressure to the plurality of nozzles; and wherein the plurality of nozzles are positioned with respect to a work piece such that lines perpendicular to the work piece surface intercept spray orifices of the plurality of nozzles such that the plurality of nozzles are adapted to direct the plurality of substantially fan shaped sprays of cooling fluid mixture directly onto the surface of the work piece and at the same angle with respect to the surface of the work piece such that a force of the sprays of cooling fluid mixture create a flow of at least the second cooling fluid in a substantially single direction along the work piece surface.

18. The apparatus of claim 17 wherein the plurality of nozzles includes at least one tube having the spray orifices formed at the same angle therein, wherein each spray orifice produces a fan shaped spray of cooling fluid mixture when the cooling fluid mixture is provided under pressure to the plurality of nozzles.

19. The apparatus of claim 18 wherein the plurality of nozzles includes array of tubes having linear arrays of the spray orifices formed at the same angle therein, wherein each of the linear arrays of spray orifices produces a fan shaped spray of cooling fluid mixture when the cooling fluid mixture is provided under pressure to the plurality of linear arrays of spray orifices.

20. The apparatus of claim 17 wherein the plurality of nozzles are positioned with respect to the work piece to direct the plurality of substantially fan shaped sprays onto the surface of the work piece at the same angle of between approximately 30 degrees and 60 degrees with respect thereto.

21. The apparatus of claim 15 comprising additionally a liquid drainage point coupled to the reservoir such that liquid cooling fluid is directed from the liquid drainage point back to the reservoir and a vapor drainage point coupled to the reservoir such that vapor cooling fluid is directed from the vapor drainage point back to the reservoir.

22. The apparatus of claim 15 comprising additionally a drainage point coupled to the reservoir such that liquid and vapor cooling fluid is directed from the drainage point back to the reservoir.

23. The apparatus of claim 15 wherein the first cooling fluid is a Fluorinert and the second cooling fluid is a different Fluorinert.

24. The apparatus of claim 15 wherein the cooling fluid mixture comprises a combination of miscible liquids selected from the group of combinations of miscible liquids consisting of: Fluorinerts-HFEs, HFEs, water-ammonia, water-LiBr, water-methanol, water-glycol, water-ethanol, water-propanol, hydrocarbon mixtures and refrigerant mixtures.

25. The apparatus of claim 15 wherein the cooling fluid mixture includes a gas selected from the group of gasses consisting of nitrogen and argon.

* * * * *